(12) United States Patent
Rohleder et al.

(10) Patent No.: US 9,176,802 B2
(45) Date of Patent: Nov. 3, 2015

(54) INTEGRATED CIRCUIT DEVICE AND METHOD OF IDENTIFYING A PRESENCE OF A BROKEN CONNECTION WITHIN AN EXTERNAL SIGNAL PATH

(75) Inventors: Michael Rohleder, Unterschleissheim (DE); Ernst Aderholz, Munich (DE); Bernhard Braun, Adelzhausen (DE); Frank Donner, Eching (DE)

(73) Assignee: Freescale Semiconductor, Inc., Austin, TX (US)

( * ) Notice: Subject to any disclaimer, the term of this patent is extended or adjusted under 35 U.S.C. 154(b) by 122 days.

(21) Appl. No.: 14/236,338

(22) PCT Filed: Aug. 31, 2011

(86) PCT No.: PCT/IB2011/053813
§ 371 (c)(1),
(2), (4) Date: Jan. 31, 2014

(87) PCT Pub. No.: WO2013/030625
PCT Pub. Date: Mar. 7, 2013

(65) Prior Publication Data
US 2014/0173353 A1    Jun. 19, 2014

(51) Int. Cl.
*G06F 11/00* (2006.01)
*G06F 11/07* (2006.01)
*G06F 11/20* (2006.01)
*G06F 11/26* (2006.01)
*G01R 31/28* (2006.01)
*H01L 21/66* (2006.01)
*H01L 23/00* (2006.01)

(52) U.S. Cl.
CPC ........ *G06F 11/0751* (2013.01); *G01R 31/2856* (2013.01); *G06F 11/0793* (2013.01); *G06F 11/20* (2013.01); *G06F 11/2005* (2013.01); *G06F 11/2007* (2013.01); *G06F 11/2069* (2013.01); *G06F 11/26* (2013.01); *G01R 31/2812* (2013.01); *H01L 22/34* (2013.01); *H01L 24/48* (2013.01); *H01L 2224/48091* (2013.01); *H01L 2924/13091* (2013.01)

(58) Field of Classification Search
CPC . G06F 11/0793; G06F 11/20; G06F 11/2005; G06F 11/26; G06F 12/0831; G06F 11/2007; G06F 11/2069
See application file for complete search history.

(56) References Cited

U.S. PATENT DOCUMENTS

| 5,956,352 | A | 9/1999 | Tatosian et al. |
| 6,472,899 | B2 | 10/2002 | Osburn et al. |
| 6,549,459 | B2 | 4/2003 | Higuchi |
| 6,556,934 | B2 | 4/2003 | Higashide |
| 6,907,376 | B2 | 6/2005 | Shepston et al. |

(Continued)

OTHER PUBLICATIONS

International Search Report and Written Opinion correlating to PCT/IB2011/053813 dated May 1, 2012.

*Primary Examiner* — Charles Ehne (57) ABSTRACT

An integrated circuit device comprises at least one connectivity identification module. The at least one connectivity identification module is arranged to determine an initial sensed state of at least one external signal path of the integrated circuit device, cause the at least one external signal path to be pulled towards an opposing state to the initial sensed state therefor, determine a new sensed state of the at least one external signal path of the integrated circuit device, and identify a presence of a broken connection within the at least one external signal path, if the new sensed state of the at least one external signal path does not match the initial sensed state of the at least one external signal path.

16 Claims, 6 Drawing Sheets

(56) References Cited

U.S. PATENT DOCUMENTS

| | | |
|---|---|---|
| 7,467,261 B2 | 12/2008 | Ueki et al. |
| 7,937,617 B1 * | 5/2011 | Nagineni et al. ................ 714/13 |
| 2005/0160328 A1 * | 7/2005 | Lesartre et al. ................ 714/48 |
| 2008/0016402 A1 * | 1/2008 | Harel et al. .................... 714/43 |
| 2008/0228987 A1 * | 9/2008 | Yagi et al. ..................... 710/316 |
| 2009/0290483 A1 * | 11/2009 | Curtis et al. .................. 370/216 |
| 2011/0083041 A1 | 4/2011 | Rohleder et al. |
| 2011/0109602 A1 | 5/2011 | Neugebauer |

\* cited by examiner

INTEGRATED CIRCUIT DEVICE AND
METHOD OF IDENTIFYING A PRESENCE
OF A BROKEN CONNECTION WITHIN AN
EXTERNAL SIGNAL PATH

FIELD OF THE INVENTION

The field of this invention relates to an integrated circuit device and a method of identifying a presence of a broken connection within an external signal path of an integrated circuit device.

BACKGROUND OF THE INVENTION

In the field of integrated circuit (IC) devices, reliable connections between different components are essential for correct functioning. In order for an IC device to be able to correctly function in relation to an external component, each connection within a signal path between the semiconductor die of the IC device and the external component must be reliable and intact, i.e. not broken. In the case of safety devices, this issue is of particular importance, since a single broken connection can result in a complete failure of the device or the system it is integrated into. For example, the root cause of such a failure may be a broken connection to an input device such as a sensor or a broken connection to an output device such as a unit controlling a motor. Thus, ensuring the reliability of connections is of major importance for safety devices.

Conventionally, this may be achieved through the use of redundant connections. However, a problem with this technique is that it requires the number of input/output pads/contacts to be substantially doubled. Since the number of input/output pads/contacts within an IC device is limited, and their availability typically at a premium, this doubling requirement is clearly undesirable.

Alternatively, the reliability of connections may be increased by repeating the corresponding input/output operations. For example, data signals may be transmitted twice, and the two versions of the transmitted data are compared in order to identify the presence of broken connections. However, a problem with this technique is that it requires specific transmission protocols or a specific functionality on the device boundary or within the transmitting or receiving device that is aware of this replication. Accordingly, such a technique increases the signalling complexity and other overheads.

Alternatively still, other means outside of the IC device may be used to determine the reliability of connections. However, a problem with this technique is that it requires specific external hardware to observe the IC device and its connections, thereby increasing the cost and real estate requirements of the system.

SUMMARY OF THE INVENTION

The present invention provides an integrated circuit device, a method of identifying a presence of a broken connection within an external signal path of an integrated circuit device and a tangible computer program product having executable program code stored therein for identifying a presence of a broken connection within an external signal path of an integrated circuit device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Examples of the present invention will now be described with reference to the accompanying drawings. However, it will be appreciated that the specific examples herein described and illustrated in the drawings are not intended to limit the scope of the invention. For example, for simplicity and clarity, examples of the present invention have been illustrated with reference to an integrated circuit device comprising a single semiconductor device provided within an integrated circuit package. However, it will be appreciated that examples of the present invention may be equally implemented within integrated circuit packages comprising multiple semiconductor dies. Furthermore, because the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Figure 1:
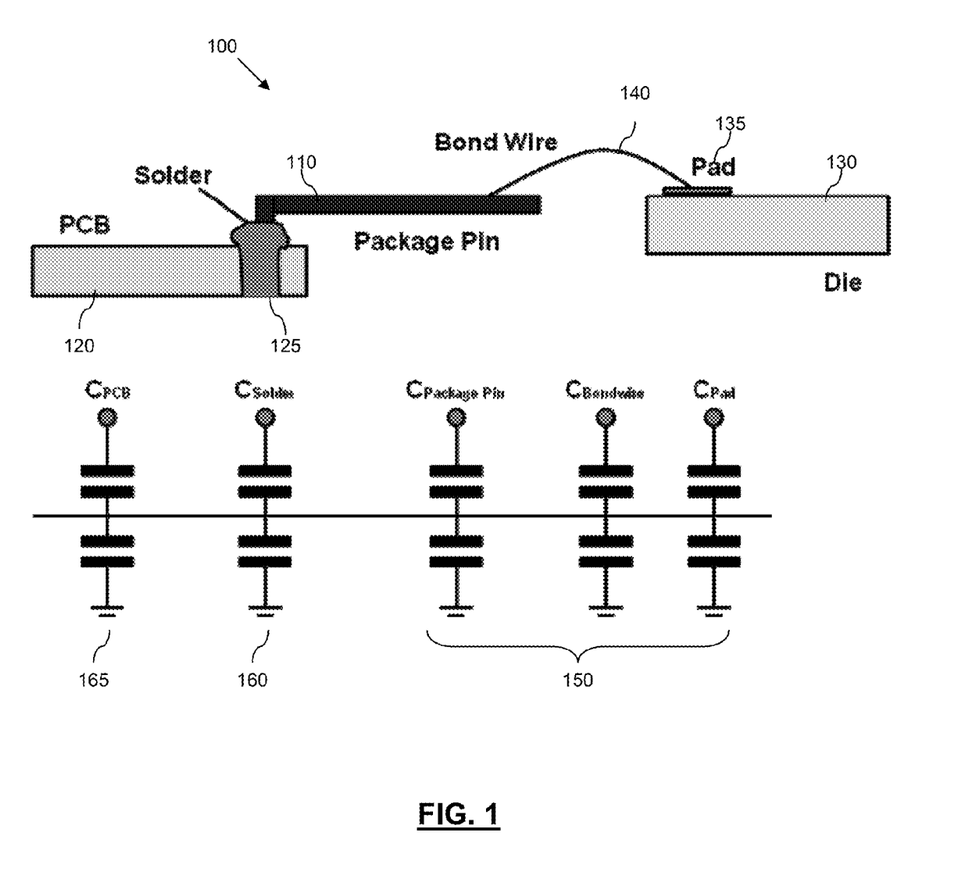
FIG. 1 illustrates a simplified example of connections between various elements within an external signal path of an integrated circuit device; providing a simplified example of the involved capacitances.

Referring first to FIG. 1, there is illustrated a simplified example of connections between various elements within an external signal path 100 of an integrated circuit device. An integrated circuit device typically comprises an integrated circuit package (not shown) comprising a plurality of external contacts, such as the package pin illustrated at 110. Such external contacts are arranged to be operably coupled to, say, a printed circuit board (PCB) 120 or the like. A traditional technique for operably coupling a package pin 110 to a PCB 120 is to solder the package pin 110 to the PCB 120, as illustrated at 125. Other package types, like Ball Grid Arrays (BGA's) use similar but different ways of contacting pads to an external device thereby resulting in different topologies and connectivity. However, in some examples, the overall idea of representing them by a series of capacitances is equally applicable. Semiconductor dies within an integrated circuit package, such as the semiconductor die 130, typically comprise pads to be coupled to the external contacts of the integrated circuit package, such as pad 135. Typically, such pads 135 are operably coupled to the external contacts 110 by way of bonding wires, such as illustrated at 140. Thus, in this manner, the external signal path 100 between, say, a semiconductor die 130 and an external component, for example residing elsewhere on the PCB 120, typically relies on a plurality of connections between different elements, both internal and external to the IC device.

The inventors have determined that each connection between the various elements within such an external signal path introduces a capacitance, such as illustrated at 150, 160 and 165. Furthermore, the inventors have determined that any broken connection within the external signal path 100 will alter an aggregated capacitance as perceived by components within the semiconductor die 130, and in particular will reduce such an aggregated capacitance as perceived by components within the semiconductor die 130.

The capacitances introduced by the various connections, etc., may be divided into two sets; a first set comprising internal, or 'on-chip' capacitances, such as illustrated at 150; and a second set comprising external, or 'off-chip' capacitances, such as illustrated at 160, 165. Typically, the individual on-chip capacitances 150 are relatively small compared to the off-chip capacitances 160, 165, and it is typically rare that an on-chip broken connection occurs, such as due to a broken bond wire.

Figure 2:
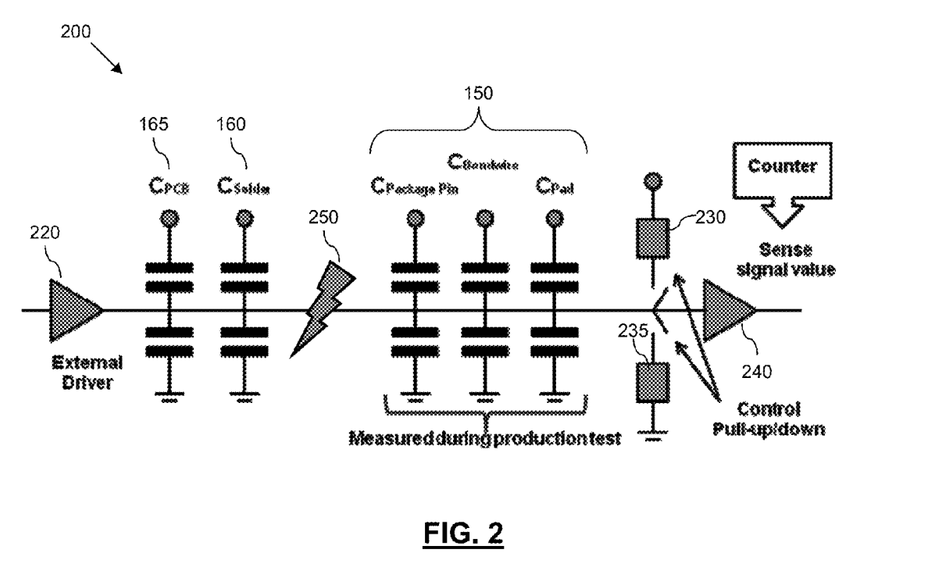
FIG. 2 illustrates a simplified example of a capacitive representation of an input signal path of an integrated circuit device, and an example of the functions involved with the identification of a broken connection.

Referring now to FIG. 2, there is illustrated a simplified example of a capacitive representation of an input signal path 200 of an integrated circuit device (not shown), and an example of the functions involved with the identification of a broken connection. The input signal path 200 comprises internal 'on-chip' capacitances 150, for example resulting from a semiconductor die pad, a bonding wire and a package pin (not shown). The input signal path 200 further comprises one or more external capacitances 160, 165, for example resulting from a solder joint and from external components residing on (and including) a PCB or the like. In operation, an external driver 220 drives the input signal path 200 to, for example, either a 'HIGH' state or a 'LOW' state as required. In the case of an intact input signal path 200, e.g. an input signal path 200 comprising no broken connections, the external driver 220 will drive the respective state along the complete length of the input signal path 200.

In accordance with some examples of the present invention, pull up and pull down circuits, for example comprising simple pull up/pull down resistors 230, 235, may be selectively coupled to the input signal path 200 at a point located within the semiconductor die (not shown), for example at a contact pad therefor. Such resistors 230, 235 may form an integral part of the pad logic. An initial sensed state of the input signal path 200, as perceived within the semiconductor die (not shown), may be determined, for example by way of a sensing element 240. One of the pull up/pull down circuits 230, 235 (as appropriate) may then be selectively coupled to the input signal path 200, such that the input signal path 200 is pulled towards an opposing sensed state to the initial sensed state therefor. After the input signal path 200 has been pulled towards the opposing sensed state for a known period of time 'T', the sensed state of the input signal path 200 may again be determined.

In accordance with some examples of the present invention, the 'state' of the signal path (as used hereafter) encompasses a sensed state, whereby a sensing element measures, calculates, senses or performs any other means of identifying a voltage state, a power state or other appropriate state that could provide a differentiate between different devices, components in identifying a broken connection.

By configuring the pull up/pull down circuits 230, 235 such that they only provide a relatively weak pull on the input signal path 200, if the input signal path 200 is intact, the external driver 220 will be able to compensate for the weak pulling up/down by the respective pull up/pull down circuit 230, 235. As such, no change in the state of the input signal path 200 will be observed. Conversely, if the input signal path 200 comprises a broken external connection, the external driver 220 will be isolated from the internal (i.e. 'on-chip') part of the input signal path 200. As such, the external driver 220 will not be able to compensate for the pulling up/down of the internal part of the input signal path 200. Thus, by configuring the period of time 'T' such that 'T' is greater than a period of time required to charge/discharge the on-chip capacitances 150 of the input signal path 200 sufficiently to cause a change of state to be determined by the sensing element 240, after the input signal path 200 has been pulled towards the opposing state for the known period of time 'T' a change in the state of the input signal path 200 will be observed when a broken connection, such as illustrated at 250, is present on the input signal path 200. The on-chip capacitances 150 may be measured during production testing in order to enable an accurate pad or device specific value for 'T' to be determined. As, the individual on-chip capacitances 150 are relatively small compared to the off-chip capacitances 160, 165, it is important to accurately measure capacitance values of the order of such on-chip capacitances 150 to be able to differentiate between devices and operations and accurately set the value 'T'.

In this manner, the presence of broken connections 250 within the input signal path 200 may be identified. Specifically, the presence of broken connections within the input signal path 200 may be identified with the only requirement on the integrated circuit device environment being that the external driver 220 maintains a substantially stable state during the process.

Figure 3:
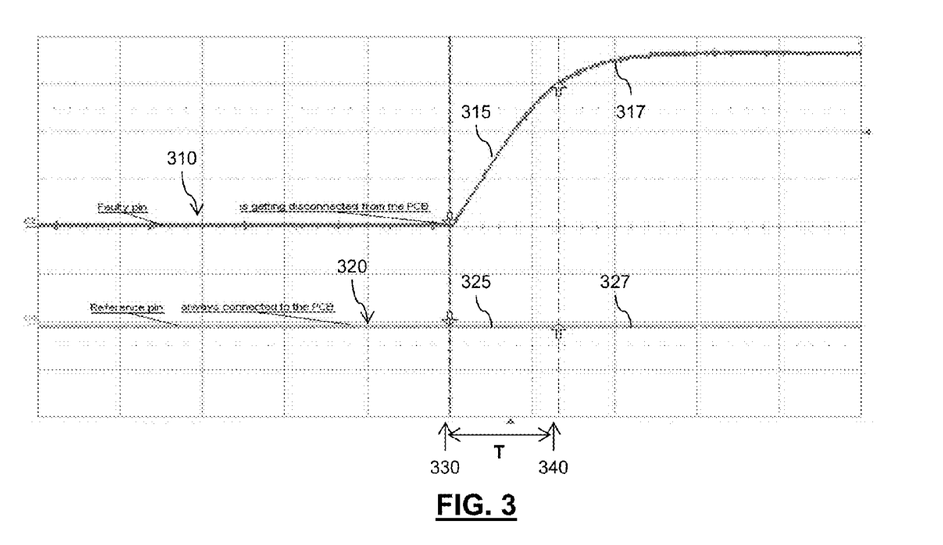
FIG. 3 illustrates a graph of voltage over time showing a voltage signal present on the input signal path of FIG. 2.

FIG. 3 illustrates a graph of voltage over time showing a first plot 310 of an example of a voltage signal that is present on the input signal path 200 of FIG. 2, as perceived by the sensing element 240, where a broken connection 250 is present on the input signal path 200. For this first plot 310, an initial state for the input signal path 200 is determined as being a 'LOW' state. Accordingly, and as described above, the pull up resistor 230 of FIG. 2 may be operably coupled to the input signal path 200 in order to enable a presence of a broken connection to be identified, at 330. For this first plot, a broken connection is present on the input signal path 200, and thus the input signal path 200 (as perceived by the sensing element 240) is not held at the initial determined 'LOW' state by the external driver 220. Accordingly, pull up resistor 230 causes the on-chip capacitances 150 of the input signal path 200 to be discharged over time. Thus, and as illustrated at 315, the voltage level at the input signal path 200, as perceived by the sensing element 240, increases. After a period of time 'T', and as illustrated at 317, the voltage level of the input signal path 200 has risen significantly, and in particular the voltage level will have changed to comprising a 'HIGH' state. Accordingly, when a new state for the input signal path 200, as perceived by the sensing element 240, is determined after the period of time 'T', the new 'HIGH' state will not match the initial 'LOW' state. Accordingly, the presence of a broken connection within the input signal path 200 may be identified.

In contrast, a second plot 320 illustrated in FIG. 3 represents an example of a voltage signal present on the input signal path 200, as perceived by the sensing element 240, where no broken connection is present (i.e. the input signal path 200 is intact). For this second plot, an initial state for the input signal path 200 is determined as being a 'LOW' state. Accordingly, the pull up resistor 230 may be operably coupled to the input signal path 200 in order to enable a presence of a broken connection to be identified, at 330. For this second plot, a broken connection is not present on the input signal path 200, and thus the input signal path 200 is held at the initial determined 'LOW' state by the external driver 220. Accordingly, and as illustrated at 325, the voltage level at the input signal path 200, as perceived by the sensing element 240, remains substantially constant. As such, after a period of time 'T', and as illustrated at 327, the voltage level of the input signal path 200 has remained substantially the same, and in particular the voltage level will still comprise a 'LOW' state. Accordingly, when a new state for the input signal path 200, as perceived by the sensing element 240, is determined after the period of time 'T', the new 'LOW' state will match the initial 'LOW' state. Accordingly, it may be determined that no broken connection is present within the input signal path 200, and thus that the input signal path 200 is intact. Significantly, and as illustrated by the second plot 320 of FIG. 3, by providing pull up/down resistors 230, 235 that apply a relatively weak pull to the input signal path 200, in the case of an intact input signal path 200 the logical state of the input signal path 200 is not affected by coupling the pull up/down resistors thereto. Thus, the above described method of identifying whether a broken connection is present on the input signal path 200 is substantially non-intrusive.

In the context of some examples of the present invention, the non-intrusive nature of the identification of a broken connection may encompass a measurement being performed for a sufficiently long time for a capacitive discharge of an internal capacitance, but being performed for a sufficiently short time to prevent a discharge of external capacitances.

Figure 4:
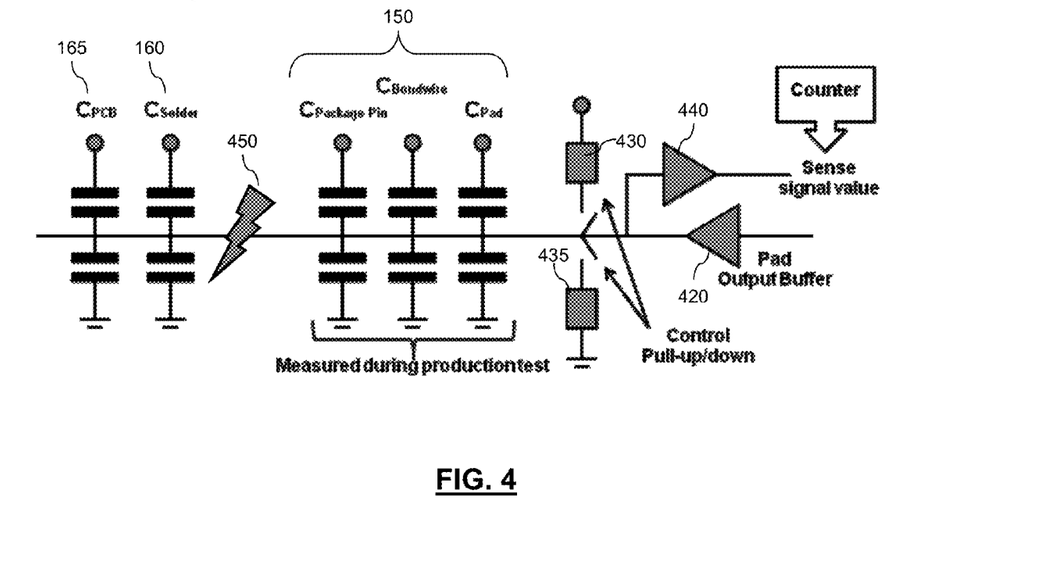
FIG. 4 illustrates a simplified example of a capacitive representation of an output signal path of an integrated circuit device, and an example of the functions involved with the identification of a broken connection.

Referring now to FIG. 4, there is illustrated a simplified example of a capacitive representation of an output signal path 400 of an integrated circuit device (not shown), and an example of the functions involved with the identification of a broken connection. The output signal path 400 comprises internal 'on-chip' capacitances 150, for example resulting from a semiconductor die pad, a bonding wire and a package pin. The output signal path 400 further comprises one or more external capacitances 160, 165, for example resulting from a solder join and from external components residing on (and including) a PCB or the like. In operation, an internal driver 420 drives the output signal path 400 to, for example, either a 'HIGH' state or a 'LOW' state as required. In the case of an intact output signal path 400, i.e. an output signal path 400 comprising no broken connections, the driver 420 will drive the respective state along the complete length of the output signal path 400.

In accordance with some examples of the present invention, pull up and pull down circuits, for example comprising simple pull up/down resistors 430, 435, may be selectively coupled to the output signal path 400 at a point located within the semiconductor die (not shown) Such resistors 430, 435 may form an integral part of the pad logic. In contrast to the input signal path 200 of FIG. 2, because the output signal path 400 is driven by the internal driver 420, even if a broken connection, such as illustrated at 450, is present within the output signal path 400, the internal driver 420 may be able to compensate for the weak pulling up/down by the respective pull up/down circuit 430, 435. Accordingly, it is contemplated that for some example embodiments, the internal driver 420 may be temporarily disabled (e.g. driven to a high-resistive High-Z state, disconnected or otherwise 'turned off') during the process herein described for identifying the presence of a broken connection within the output signal path 400 in order to enable the pull up/down circuits 430, 435 to effect the voltage level thereof.

In order to enable the presence of a broken connection within the output signal path 400 to be identified, an initial state of the output signal path 400 as perceived within the semiconductor die (not shown) may be determined, for example by way of a sensing element 440. One of the pull up/down circuits 430, 435 (as appropriate) may then be selectively coupled to the output signal path 400 such that the output signal path 400 is pulled towards an opposing state to the initial state therefor. After the output signal path 400 has been pulled towards the opposing state for a known period of time 'T', the state of the output signal path 400 may again be determined.

By configuring the period of time 'T' such that 'T' is greater than a period of time required to charge/discharge the on-chip capacitances 150 of the output signal path 400 sufficiently to cause a change of state to be determined by the sensing element 440, after the output signal path 400 has been pulled towards the opposing state for the known period of time 'T', a change in the state of the output signal path 400 will be observed when a broken connection, such as illustrated at 450, is present on the output signal path 400.

Conversely, by configuring the period of time 'T' such that 'T' is less than a period of time required to charge/discharge an aggregated capacitance comprising the combined on-chip capacitances 150 and external capacitances 160, 165 of the output signal path 400 sufficiently to cause a change of state to be determined by the sensing element, after the output signal path 400 has been pulled towards to opposing state for the known period of time 'T', a change in the state of the output signal path 400 will not occur when the output signal path 400 is intact.

The time required to charge/discharge the respective capacitances will be dependent on the size of the capacitances, as well as the strength with which the pull up/down elements 430, 435 pull the output signal path 400 when connected thereto. Significantly, by configuring the pull up/down elements 430, 435 to comprise a relatively weak pulling strength, a suitably large and measurable time difference between:

(a) the time require to charge/discharge the on-chip capacitances 150 of the output signal path 400 sufficiently to cause a change of state to be determined by the sensing element 440; and (b) the time required to charge/discharge an aggregated capacitance comprising the combined on-chip capacitances 150 and external capacitances 160, 165 of the output signal path 400 sufficiently to cause a change of state to be determined by the sensing element 440, may be achieved.

For example, such a time difference may be in, say, the nanosecond range. The time required to charge/discharge such an aggregated capacitance comprising the combined on-chip capacitances 150 and external capacitances 160, 165 of the output signal path 400 is typically likely to be in the region of twice the time required to charge/discharge just the on-chip capacitances 150 of the output signal path 400.

Figure 8:
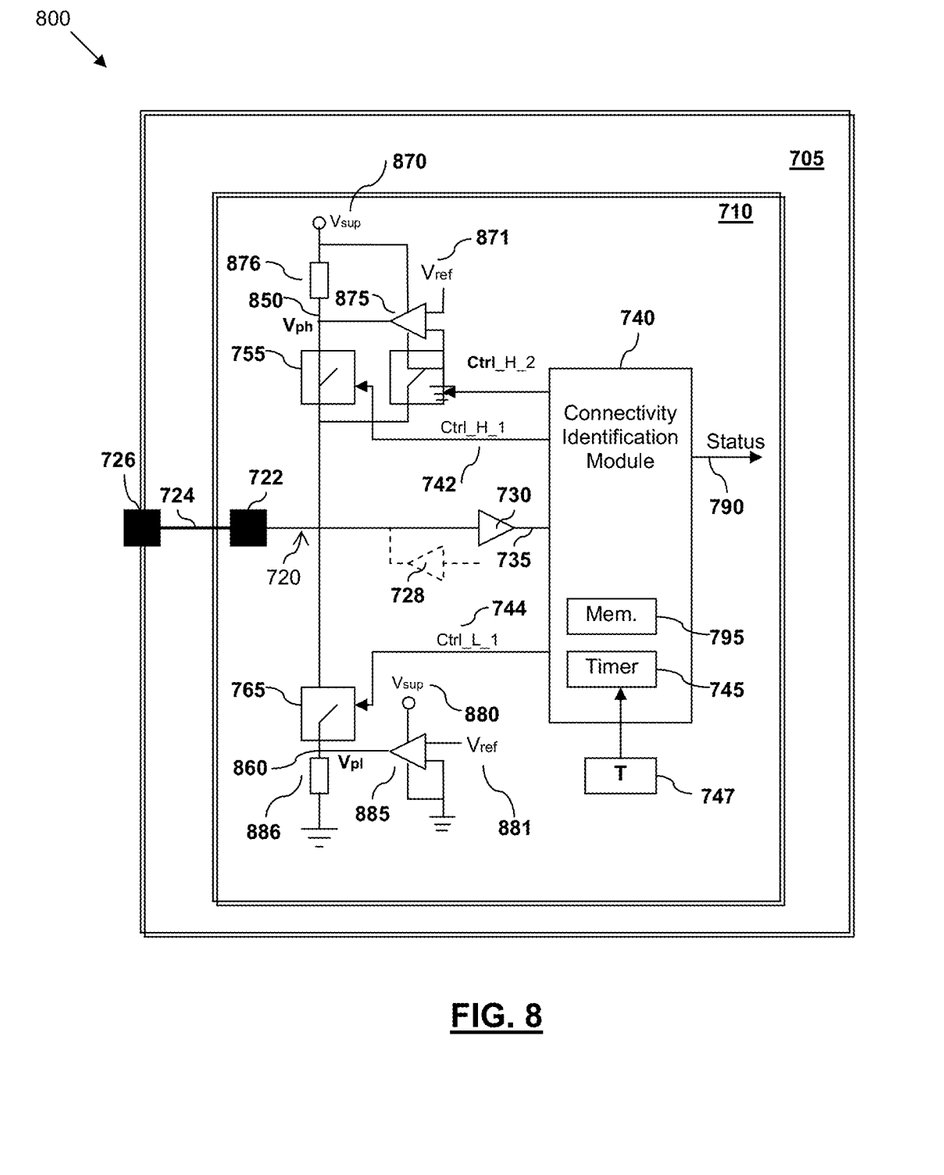
FIG. 8 illustrates an alternative simplified block diagram of an example of an integrated circuit device.

Some example arrangements/circuits for controlling the pulling strength of pull up/down elements, such as pull up/down elements 430, 435, are illustrated with respect to FIG. 8.

Thus, in accordance with some examples of the present invention, after the output signal path 400 has been pulled towards the opposing state for the known period of time 'T', where 'T' is arranged to be:

greater than a period of time required to charge/discharge the on-chip capacitances 150 of the output signal path 400 sufficiently to cause a change of state to be determined by the sensing element 440; and less than a period of time required to charge/discharge an aggregated capacitance comprising the combined on-chip capacitances 150 and external capacitances 160, 165 of the output signal path 400 sufficiently to cause a change of state to be determined by the sensing element 440 (and thus also be external components), the state of the output signal path 400 may be determined. Specifically, if the output signal path 400 is intact, and thus the output signal path 400 comprises an aggregated capacitance comprising the combined on-chip capacitances 150 and external capacitances 160, 165 as perceived by the pull up/down elements 430, 435 and the sensing element 440, after the output signal path 400 has been pulled towards the opposing state for the known period of time 'T', a change of state of the output path 400 will not be observed by the sensing element 440 (and thus nor by external components). Conversely, if a broken connection 450 is present within the output signal path 400, and thus the output signal path 400 comprises only the on-chip capacitances 150, as perceived by the pull up/down elements 430, 435 and the sensing element 440, after the output signal path 400 has been pulled towards the opposing state for the known period of time 'T', a change of state of the output signal path 400 will be observed by the sensing element 440.

Significantly, in the case where the output signal path 400 is intact, because the period of time 'T' is less than a period of time required to charge/discharge an aggregated capacitance comprising the combined on-chip capacitances 150 and external capacitances 160, 165 of the output signal path 400 sufficiently to cause a change of state, the process herein described may be substantially non-intrusive, thereby having substantially no effect that can be sensed by an external component connected to the output signal path 400.

Figure 5:
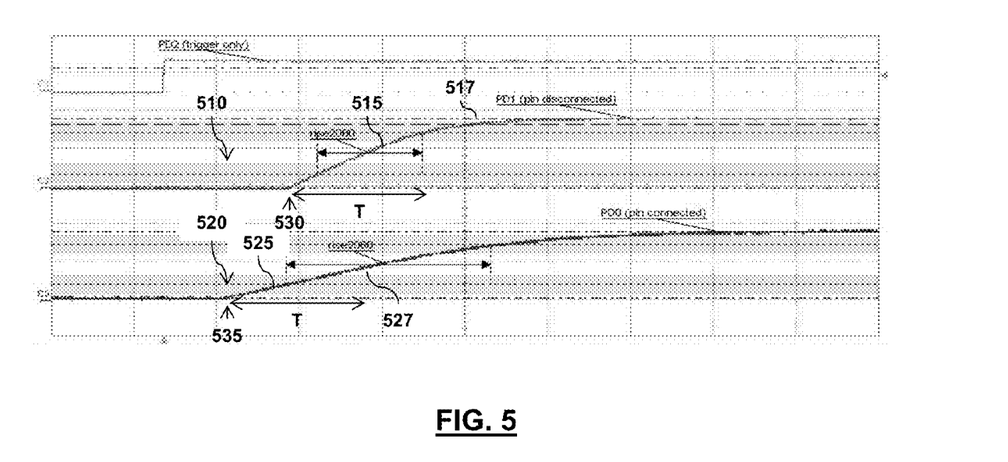
FIG. 5 illustrates a graph of voltage over time showing a voltage signal present on the output signal path of FIG. 4.

FIG. 5 illustrates a graph of voltage over time showing a first plot 510 of an example of a voltage signal present on the output signal path 400, as perceived by the sensing element 440, where a broken connection 450 is present on the output signal path 400. For this first plot 510, an initial state for the output signal path 400 is determined as being a 'LOW' state. Accordingly, and as described above, the pull up resistor 430 may be operably coupled to the output signal path 400 in order to enable a presence of a broken connection to be identified, at 530. For this first plot, a broken connection is present on the output signal path 400, and thus the output signal path 400 comprises only the on-chip capacitances 150, as perceived by the pull up/down elements 430, 435 and the sensing element 440. Thus, and as illustrated at 515, the pull up resistor 430 causes the voltage level of the output signal path 400, as perceived by the sensing element 440, to increase at a sufficiently high rate such that, after a period of time 'T', and as illustrated at 517, the voltage level of the output signal path 400 has risen significantly, and in particular the voltage level will have changed to comprising a 'HIGH' state. Accordingly, when a new state for the output signal path 400, as perceived by the sensing element 440, is determined after the period of time 'T', the new 'HIGH' state will not match the initial 'LOW' state. Accordingly, the presence of a broken connection within the output signal path 400 may be identified.

In contrast, a second plot 520 illustrated in FIG. 5 represents an example of a voltage signal present on the output signal path 400, as perceived by the sensing element 440, where no broken connection is present (i.e. the output signal path 400 is intact). For this second plot, an initial state for the output signal path 400 is determined as being a 'LOW' state. Accordingly, the pull up resistor 430 may be operably coupled to the output signal path 400 in order to enable a presence of a broken connection to be identified, at 535. For this second plot, a broken connection is not present on the output signal path 400, and thus the output signal path 400 comprises an aggregated capacitance comprising the combined on-chip capacitances 150 and external capacitances 160, 165 of the output signal path 400.

It is noted that the period of time 'T' needs to be accurately determined, as a skilled artisan will appreciate that if a too long a period is selected, a state change will occur naturally. As illustrated in FIG. 5, a change in the signal value will also occur, but at a much later point in time. For example, the plot 520 shows what will happen when not terminating to pull the signal into an opposed value. Therefore the pulling of the external signal to the opposed state after a time period 'T' will be terminated at time point 527 by (re-)enabling the pad output buffer 420 after identifying the second sensed state. In this case the voltage will swing back quickly to the initial sensed state (as driven by the pad output buffer), and no change can be sensed by an external object connected to the external signal. Hence, it is important to perform a measurement early enough to not see a state change sensed by an external device. Thus, in some example embodiments, and in particular in a case of an output signal path, there is a need to disable the related driver and perform the measurement within a certain time frame to allow the charge of internal capacitances to be discharged whilst the charges of external capacitances are not resulting in a change of the value sensed by an external device.

Thus, and as illustrated at 525, the pull up resistor 430 causes the voltage level of the output signal path 400, as perceived by the sensing element 440, to increase at a slower rate than that of the first plot 510 such that, after a period of time 'T', and as illustrated at 527, the voltage level of the output signal path 400 has not risen sufficiently to have caused the voltage level to have changed, which after the period of time 'T' remains at a 'LOW' state. Accordingly, when a new state for the output signal path 400, as perceived by the sensing element 440, is determined after the period of time 'T', the new 'LOW' state will match the initial 'LOW' state. Accordingly, it may be determined that no broken connection is present within the output signal path 400, and thus that the output signal path 400 is intact.

Significantly, and as illustrated by the second plot 320 of FIG. 3, by limiting the period of time 'T' to be less than a period of time required to charge/discharge an aggregated capacitance comprising the combined on-chip capacitances 150 and external capacitances 160, 165 of the output signal path 400 sufficiently to cause a change of state to be determined by the sensing element 440 (and thus also be external components), in the case of an intact output signal path 400 the logical state of the output signal path 400 sensed by an external device coupled to this signal need not be affected by coupling the pull up/down resistors thereto for the period of time 'T'. Thus, the above described method of identifying whether a broken connection is present on the output signal path 400 may be substantially non-intrusive.

Figure 6:
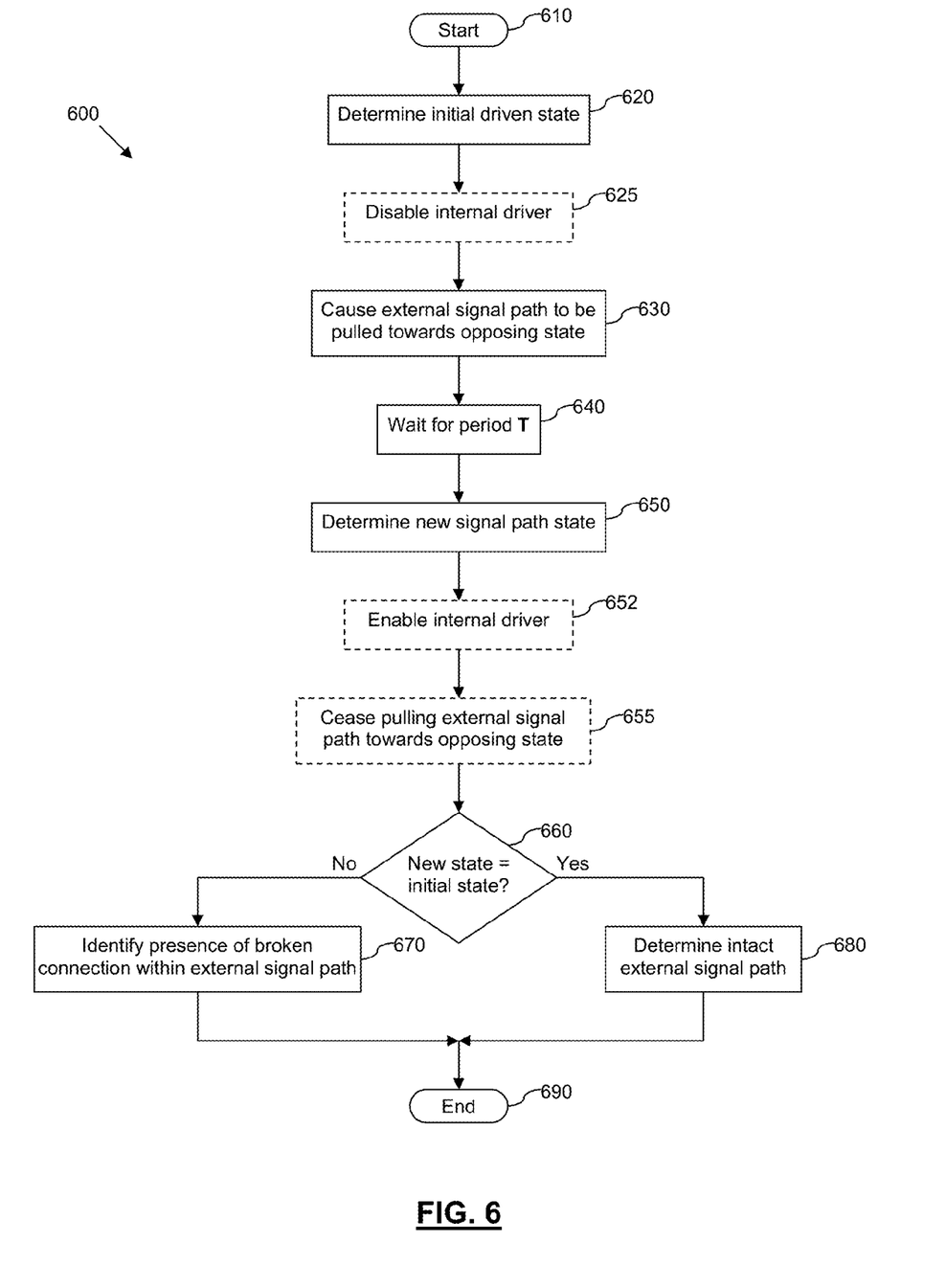
FIG. 6 illustrates a simplified flowchart of an example of a method of identifying a presence of a broken connection within an external signal path of an integrated circuit device.

Referring now to FIG. 6, there is illustrated a simplified flowchart 600 of an example of a method of identifying a presence of a broken connection within an external signal path of an integrated circuit device. In particular, the method of FIG. 6 may implement at least some of the features described above.

The method starts at 610, and moves on to 620 with determining an initial driven state of an external signal path. Optionally, and in particular in the case of the external signal path comprising an output signal path, such as the output signal path 400 of FIG. 4, an internal driver for the external signal path may be disabled, at 625. The external signal path is subsequently pulled towards an opposing state to the initial state therefor, at 630, for example by way of a pull up/down circuit (as appropriate) being connected to the external signal path. For some alternative examples, it is contemplated that the optional disabling of the internal driver at 625 may be equally performed prior to determining the initial driven state at 620, or may even be performed after pulling of the external signal path towards an opposing state has been initiated at 630.

The method then waits, at 640, for the known period of time 'T', where 'T' is greater than a period of time required to charge/discharge on-chip capacitances of the external signal path sufficiently to cause a change of state to be determined by a sensing element. In the case of the external signal path comprising an output signal path, 'T' may also be arranged to be less than a period of time required to charge/discharge an aggregated capacitance comprising the combined on-chip capacitances and external capacitances of the output signal path sufficiently to cause a change of state to be determined by the sensing element. Additionally, the pull up/down circuit may be arranged to pull the external signal path up/down with a sufficiently weak strength such that: a) in the case of an input signal path, an external driver is able to compensate for the pulling up/down of the input signal path thereby; and b) in the case of an output signal path, a suitably large and measurable time difference between the time require to charge/discharge the on-chip capacitances of the output signal path sufficiently to cause a change of state to be determined by the sensing element, and the time required to charge/discharge an aggregated capacitance comprising the combined on-chip capacitances and external capacitances of the output signal path sufficiently to cause a change of state to be determined by the sensing element, may be achieved.

After the known period of time 'T', a new signal path state is determined, at 650. Optionally, and in particular in the case of the external signal path comprising an output signal path, such as the output signal path 400 of FIG. 4, an internal driver for the external signal path may be re-enabled, at 652, in order to minimise the disruption to the driven signal. For the illustrated example, having determined the new signal path state, the pulling of the external signal path towards an opposing state to the initial state therefor may then be ceased at 655, for example by way of the pull up/down circuit (as appropriate) being disconnected from the external signal path. In some alternative examples, it is contemplated that the ceasing of the pulling of the external signal path towards an opposing state at 655 may equally be performed at substantially any stage after the new signal path state has been determined at 650, and indeed because of the relatively weak pull envisaged, even should such pulling not be ceased, normal operation of the external signal path is capable of being resumed. The new signal path state is then compared to the initial state of the signal path, at 660. If the new signal path state matches the initial signal path state (i.e. the logical state of the external signal path has not been changed during the period 'T' by the pull up/down circuit), it may be determined that the external signal path is intact, at 680. Conversely, if the new signal path state does not match the initial signal path state (i.e. the logical state of the external signal path has been changed during the period 'T' by the pull up/down circuit), it may be determined that a broken connection has been identified within the external signal path, at 670. The method then ends at 690.

Figure 7:
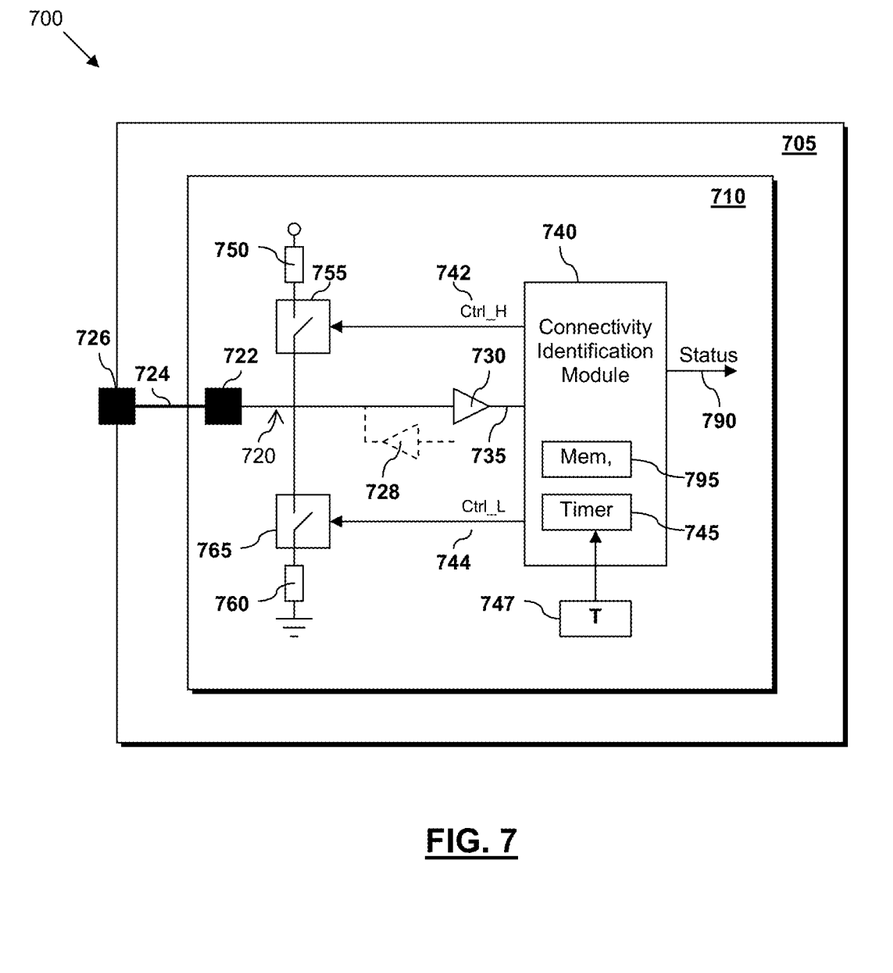
FIG. 7 illustrates a simplified block diagram of an example of an integrated circuit device.

Referring now to FIG. 7, there is illustrated a simplified block diagram of an example of an integrated circuit device 700. The integrated circuit device 700 comprises at least one semiconductor die 710 located within an integrated circuit package 705. The integrated circuit device 700 further comprises at least one external signal path 720 arranged to operably couple the semiconductor die 710 to one or more external components (not shown). In the illustrated example, the external signal path 720 comprises a contact pad 722 of the semiconductor device, an external contact 726 such as a package pin, and a bonding wire 724 operably coupling the pad 722 to the bonding wire. In use, the external contact 726 may be operably coupled to, say a PCB (not shown) or the like by way of a solder connection etc.

The integrated circuit device 700 further comprises at least one connectivity identification module 740. The at least one connectivity identification module 740 is arranged to determine an initial state of at least one external signal path 720. For example, the connectivity identification module 740 may be arranged to received an indication 735 of a logical state of the at least one external signal path 720 from sensing element 730. Although in the illustrated example the at least one connectivity identification module 740 is operably coupled to sensing element 730, in other examples the connectivity identification module 740 may encompass multiple connectivity identification modules 740 and/or comprise the (one or more) sensing element(s) 730. In some examples, the sensing element 730 is arranged to determine the indication of the new sensed state 735 by way of a representation of a signal value at the external signal path 720, such as a voltage state representation, a power state representation.

The connectivity identification module 740 then causes the at least one external signal path 720 to be pulled towards an opposing state to the initial state therefor, and subsequently determines a new state of the at least one external signal path 720 of the integrated circuit device 700, for example based on an indication 735 of a logical state of the at least one external signal path 720 from sensing element 730. The connectivity identification module is then arranged to identify a presence of a broken connection within the at least one external signal path 720, if the new state of the at least one external signal path 720 does not match the initial state of the at least one external signal path 720. In some examples, the presence of a broken connection within the at least one external signal path 720 may be identified in a non-intrusive manner, for example in a way that the state of the at least one external signal path 720 sensed at an external object (outside the integrated circuit device) is not modified. The connectivity identification module 740 may comprise a status output 790 via which the connectivity identification module 740 may provide an indication of whether a broken connection has been identified on the external signal path 720, for example to a system-on-chip (SoC) component (not shown) of the integrated circuit device 700.

For some examples, the at least one connectivity identification module 740 of FIG. 7 is arranged to determine a new state of the at least one external signal path 720 of the integrated circuit device 700 after the known period 'T' from causing the at least one external signal path 720 to be pulled towards an opposing state to the initial state therefor. Accordingly, the connectivity identification module 740 may comprise a timer 745 arranged to count up/down for a period 'T'. For some examples, the timer 745 may be operably coupled to a programmable memory element/register 747 within which the period 'T' may be programmable stored. In this manner, the period 'T' may be configured according to the individual internal and external characteristics of the external signal path 720, etc. For some examples, the known period 'T' may be greater than a period of time required to charge/discharge at least on-chip capacitances (not shown) of the at least one external signal path 720. Furthermore, since this time can be pad and device specific, it may be determined for every pad and device instance during production test, for example a first device may have, say, a 29 pF on-chip capacitance and a second device may have, say, a 30 pF on-chip capacitance.

The at least one external signal path may comprise an input signal path, such as the input signal path 200 of FIG. 2. Alternatively, the at least one external signal path 720 may comprise an output signal path, such as the output signal path 400 of FIG. 4. For some examples, and in particular for examples in which the external signal path comprises an output signal path, the known period 'T' may be less than a period of time required to charge/discharge an aggregated capacitance comprising on-chip capacitances and external capacitances of the external signal path 720.

For some examples where the external signal path comprises an output signal path, the connectivity identification module 740 may be further arranged to disable an internal driver 728 of the output signal path 720 prior to causing the output signal path 720 to be pulled towards an opposing state to the initial state therefor; and to re-enable it after determining a broken or non-broken connection.

For the example illustrated in FIG. 7, the integrated circuit device 700 further comprises at least one pull up element 750 selectively couplable to the at least one external signal path 720 and arranged to pull the at least one external signal path 720 to a first, 'HIGH', state upon being coupled thereto, and at least one pull down element 760 selectively couplable to the at least one external signal path 720 and arranged to pull the at least one external signal path 720 to a second, 'LOW', state upon being coupled thereto. The connectivity identification module 740 may accordingly be further arranged to cause the at least one external signal path 720 to be pulled towards an opposing state to the initial state therefor by selectively coupling the appropriate pull up/down element thereto.

For some examples, the pull up or pull down elements 750, 760 may be arranged to pull the at least one external signal path 720 to respective states in a sufficiently weak manner, such that they are only capable of substantially affecting a state of the at least one external signal path in the absence of a driver (internal or external) driving the at least one external signal path 720.

For some examples, it is contemplated that a strength with which the pull up/down elements 750, 760 are arranged to pull the at least one external signal path 720 to a respective state may be configurable. For example, the pull up/down elements 750, 760 may be operably coupled to the at least one external signal path 720 by way of controllable switching elements 755, 765, whereby each controllable switching element 755, 765 may be controllable to selectively couple the respective pull up/down element 750, 760 to the external signal path 720 in accordance with a control signal 742, 744 from the connectivity identification module 740. Additionally, each controllable switching element 755, 765 may be arranged to selectively couple the respective pull up/down element 750, 760 to the external signal path 720 with a configurable resistance or driver strength. For example, the switching elements 755, 765 may comprise transistor elements, such as metal oxide field effect transistors (MOSFETs).

Referring to FIG. 8, there is illustrated a simplified block diagram of an alternative example of an integrated circuit device 800. The integrated circuit device 800 comprises a number of the same components as the integrated circuit device 700 of FIG. 7, with like components being referenced with like numbers. However, the integrated circuit device 800 of FIG. 8 differs from that of FIG. 7 in that the integrated circuit device 800 comprises a different implementation for at least one pull up and at least one pull down elements for the external path 720.

This implementation may use one or more compensation element 875 that may be coupled to a controllable switch 755 and a resistor 876. In the illustrated example, the compensation element 875 uses a reference voltage $V_{ref}$ 871 provided by a source (not shown) in order to adjust or otherwise control the resistance value of resistor 876, or the drive strength of the signal 850, or the voltage $V_{ph}$ in relation to the supply voltage $V_{sup}$ 870. In other examples, various possible implementations of such a compensation element may be applied. In this example, a more accurate selection of the drive strength, needed for pulling a state of the related external signal path 720 into the opposite direction (or opposed state, e.g. a first, 'HIGH' state), may be achieved. Having such a capability allows a more exact selection of the time constant 'T' in order to discharge the one or more internal capacitance(s), and thus a more exact measurement.

Furthermore, the illustrated example may use one or more further compensation element(s) 885 that may be coupled to a second controllable switch 765 and a second resistor 886. The one or more further compensation element(s) may use a reference voltage $V_{ref}$ 881 provided by a source (not shown) in order to adjust or otherwise control the resistance value of the second resistor 886, or the drive strength of the signal 860, or the voltage $V_{pl}$ in relation to the supply voltage $V_{sup}$ 880. In this example, a more accurate selection of the drive strength, needed for pulling a state of the related external signal path 720 into the opposite direction may be achieved. In the case of FIG. 8 the one or more further compensation element(s) may be turned off, since only the pull up path is enabled.

In one example embodiment, the at least one controllable switching element 755, 765 may be arranged to selectively couple one or more of the pull up or pull down elements 750, 876, 760, 886 under control of the connectivity identification module 740 (or another component or module not shown) in response to a change in at least one environmental condition, for example a change or sensed change in supply voltage, a change in temperature, a change in humidity.

Thus, in this manner, the strength with which the pull up/down elements 755, 876, 765, 886 is/are arranged to pull the at least one external signal path 720 to a respective state may be adjusted by the corresponding first or second compensation element(s) 875, 885 attached to the pull up/down elements coupled to the external signal path 720. In some examples, the at least one compensation element attached to the pull up/down elements 755, 876, 765, 886 may be made configurable by the connectivity identification module 740, for example according to any relevant measurement performed, for example during production test to generate trimming information to further improve the accuracy of the compensation.

For some examples, it is contemplated that the connectivity identification module 740 (in FIG. 7) may be arranged to execute executable program code stored within, say, a memory element 795 or other tangible computer program product, the program code being operable for programming the connectivity identification module 740 to identify the presence of broken connections within the external signal path 720 described above.

Accordingly, the invention may be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; non-volatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the pull up/down elements and sensing elements have been illustrated and described in the various examples as comprising components distinct from the connectivity identification module. However, such pull up/down elements and/or sensing elements may be implemented as integral parts of the connectivity identification module.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit device comprising:
   at least one connectivity identification module; the at least one connectivity identification module being arranged to:
   determine an initial sensed state of at least one external signal path of the integrated circuit device;
   cause the state of the at least one external signal path to be pulled towards an opposed state relative to the initial sensed state therefor;
   determine a new sensed state of the at least one external signal path of the integrated circuit device; and
   identify a presence of a broken connection within the at least one external signal path, if the new sensed state of the at least one external signal path does not match the initial sensed state of the at least one external signal path.

2. The integrated circuit device of claim 1 wherein the at least one connectivity identification module is arranged to identify a presence of a broken connection within the at least one external signal path in a non-intrusive manner.

3. The integrated circuit device of claim 1 wherein the at least one connectivity identification module is arranged to determine a new sensed state of the at least one external signal path of the integrated circuit device after a known period 'T' from causing the at least one external signal path to be pulled towards an opposed state relative to the initial sensed state therefor.

4. The integrated circuit device of claim 3, wherein the known period 'T' is identified by at least one from a group consisting of: a calculation, a measurement at an external device, a measurement at the actual device, and derived by a measurement from reference information from at least one of: a voltage value, a power value, a time value.

5. The integrated circuit device of claim 3 wherein the known period 'T' is greater than a period of time required to charge or discharge at least on-chip capacitances of the at least one external signal path.

6. The integrated circuit device of claim 3 wherein the known period 'T' is less than a period of time required to charge or discharge an aggregated capacitance comprising on-chip capacitances and at least one additional external capacitance of the at least one external signal path.

7. The integrated circuit device of claim 1 wherein the at least one connectivity identification module comprises or is operably coupled to a sensing element arranged to determine the new sensed state by way of a representation of a signal value at the external signal path including one of a group consisting of: a voltage state representation, and a power state representation.

8. The integrated circuit device of claim 1 wherein the at least one external signal path comprises at least one from a group consisting of: an input signal path; and an output signal path.

9. The integrated circuit device of claim 7 wherein the at least one connectivity identification module is further arranged to disable at least an internal driver coupled to the output signal path when causing the output signal path to be pulled towards an opposing state relative to the initial sensed state therefor.

10. The integrated circuit device of claim 1 wherein the integrated circuit device further comprises at least one pull up element selectively couplable to the at least one external signal path and arranged to pull the at least one external signal path to a first, 'HIGH' sensed state, and at least one pull down element selectively couplable to the at least one external signal path and arranged to pull the at least one external signal path to a second, 'LOW' state;
    the connectivity identification module being arranged to cause the at least one external signal path to be pulled towards an opposed state relative to the initial sensed state therefor by selectively coupling the appropriate pull up or pull down element thereto.

11. The integrated circuit device of claim 1 wherein the at least one connectivity identification module is arranged to cause the at least one external signal path to be pulled towards an opposed state relative to the initial sensed state therefor in a sufficiently weak manner such that a sensed state of the at least one external signal path is only affected in absence of a driver driving the at least one external signal path.

12. The integrated circuit device of claim 10 further comprising at least one controllable switching element arranged to selectively couple the pull up or pull down elements to pull the at least one external signal path to a respective sensed state.

13. The integrated circuit device of claim 12 wherein the at least one controllable switching element is arranged to selectively couple the pull up or pull down elements to pull the at least one external signal path to a respective sensed state via at least one from a group consisting of: a configurable resistor or a configurable driver or a configurable supply.

14. The integrated circuit device of claim 12 wherein the at least one controllable switching element is arranged to selectively couple the pull up or pull down elements in response to a change in at least one environmental condition including one of a group consisting of: a change in supply voltage, a change in temperature, and a change in humidity.

15. A method of identifying a presence of a broken connection within an external signal path of an integrated circuit device, the method comprising:
- determining an initial sensed state of at least one external signal path of the integrated circuit device;
- causing the state of the at least one external signal path to be pulled towards an opposed state relative to the initial sensed state therefor;
- determining a new sensed state of the at least one external signal path of the integrated circuit device after waiting for a known time; and
- identifying a presence of a broken connection within the at least one external signal path, if the new sensed state of the at least one external signal path does not match the initial sensed state of the at least one external signal path.

16. A tangible computer program product having executable program code stored therein for identifying a presence of a broken connection within an external signal path of an integrated circuit device, the program code operable for:
- determining an initial sensed state of at least one external signal path of the integrated circuit device;
- causing the at least one external signal path to be pulled towards an opposed state relative to the initial state therefor;
- determining a new sensed state of the at least one external signal path of the integrated circuit device for example after waiting for a known time; and
- identifying a presence of a broken connection within the at least one external signal path, if the new sensed state of the at least one external signal path does not match the initial sensed state of the at least one external signal path.

* * * * *